(12) United States Patent
Fang et al.

(10) Patent No.: US 8,173,531 B2
(45) Date of Patent: May 8, 2012

(54) STRUCTURE AND METHOD TO IMPROVE THRESHOLD VOLTAGE OF MOSFETS INCLUDING A HIGH K DIELECTRIC

(75) Inventors: Sunfei Fang, Hopewell Junction, NY (US); Brian J. Greene, Hopewell Junction, NY (US); Effendi Leobandung, Hopewell Junction, NY (US); Qingqing Liang, Hopewell Junction, NY (US); Edward P. Maciejewski, Hopewell Junction, NY (US); Yanfeng Wang, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 141 days.

(21) Appl. No.: 12/535,183

(22) Filed: Aug. 4, 2009

(65) Prior Publication Data

US 2011/0031554 A1 Feb. 10, 2011

(51) Int. Cl.
*H01L 21/8238* (2006.01)
*H01L 21/336* (2006.01)
(52) U.S. Cl. .. 438/585; 438/775; 438/776; 257/E21.194
(58) Field of Classification Search .................. 438/585, 438/775, 776; 257/E21.194
See application file for complete search history.

(56) References Cited

U.S. PATENT DOCUMENTS

| | | | |
|---|---|---|---|
| 6,043,138 A | 3/2000 | Ibok | |
| 6,417,046 B1 * | 7/2002 | Ho et al. | 438/257 |
| 6,759,302 B1 | 7/2004 | Chen et al. | |
| 7,015,534 B2 * | 3/2006 | Colombo | 257/314 |
| 7,091,119 B2 * | 8/2006 | Colombo | 438/595 |
| 7,105,889 B2 * | 9/2006 | Bojarczuk et al. | 257/324 |
| 7,118,974 B2 | 10/2006 | Chen et al. | |
| 7,138,317 B2 | 11/2006 | Chen et al. | |
| 7,138,691 B2 | 11/2006 | Burnham et al. | |
| 7,179,754 B2 | 2/2007 | Kraus et al. | |
| 7,242,055 B2 * | 7/2007 | Bojarczuk et al. | 257/324 |
| 7,247,890 B2 * | 7/2007 | Sekiguchi et al. | 257/192 |
| 7,361,973 B2 * | 4/2008 | Chidambarrao et al. | 257/623 |
| 7,456,115 B2 * | 11/2008 | Chou et al. | 438/775 |
| 7,897,450 B2 * | 3/2011 | Koehler et al. | 438/216 |
| 2004/0171241 A1 * | 9/2004 | Kitamura et al. | 438/592 |
| 2004/0195637 A1 | 10/2004 | Chen et al. | |
| 2004/0198000 A1 | 10/2004 | Chen et al. | |
| 2004/0198001 A1 | 10/2004 | Chen et al. | |
| 2004/0214398 A1 | 10/2004 | Chen et al. | |
| 2004/0242021 A1 * | 12/2004 | Kraus et al. | 438/776 |
| 2005/0101147 A1 * | 5/2005 | Labelle et al. | 438/710 |
| 2005/0164444 A1 | 7/2005 | Burnham et al. | |
| 2006/0216944 A1 | 9/2006 | Kraus et al. | |
| 2006/0281265 A1 | 12/2006 | Burnham et al. | |
| 2008/0164532 A1 * | 7/2008 | Chidambarrao et al. | 257/369 |
| 2008/0246099 A1 * | 10/2008 | Varghese et al. | 257/410 |
| 2009/0302399 A1 * | 12/2009 | Cartier et al. | 257/407 |
| 2010/0044805 A1 * | 2/2010 | Callegari et al. | 257/410 |
| 2010/0120245 A1 * | 5/2010 | Tjandra et al. | 438/660 |

* cited by examiner

*Primary Examiner* — George Fourson, III
(74) *Attorney, Agent, or Firm* — Scully, Scott, Murphy & Presser, P.C.; Joseph P. Abate, Esq.

(57) ABSTRACT

A method of forming threshold voltage controlled semiconductor structures is provided in which a conformal nitride-containing liner is formed on at least exposed sidewalls of a patterned gate dielectric material having a dielectric constant of greater than silicon oxide. The conformal nitride-containing liner is a thin layer that is formed using a low temperature (less than 500° C.) nitridation process.

19 Claims, 5 Drawing Sheets

STRUCTURE AND METHOD TO IMPROVE THRESHOLD VOLTAGE OF MOSFETS INCLUDING A HIGH K DIELECTRIC

BACKGROUND

The present invention relates to a semiconductor device and to a method of forming a semiconductor device. More particularly, the present invention relates to a metal oxide semiconductor field effect transistor (MOSFET) including a high k gate dielectric in which the threshold voltage of the device is improved and to a method of fabricating the same.

In semiconductor devices including field effect transistors (FETs), threshold voltage of the transistors has been conventionally controlled by doping an impurity into the channel region and by appropriately adjusting the dose amount. Threshold voltage control using only this technique, e.g., only through adjustment of the amount of the channel impurity, however, raises nonconformities such that an increase in the dose of the impurity to be doped into the channel region may lower ON-state current due to scattering by the impurity, may increase the Gate-Induced Drain Leakage (GIDL) current, and may increase substrate current upon application of substrate voltage. For this reason, low-power-consumption devices having a large amount of impurity doped into the channel region have occasionally resulted in a decrease in an ON-state current, and an increase in the GIDL current.

Another prior art technique that has been conventionally used to control the threshold voltage of FET devices is to fabricate a device in which different conductivity type transistors, e.g., nFETs and pFETs, are formed on gate oxides that have a different thickness. That is, it is known to form a device in which the thickness of a gate oxide film of an nFET is different from that of a gate oxide film of a pFET.

In recent years, there has been another trend of using a high dielectric constant film, i.e., a high k dielectric, as the gate insulating film of FET devices. High k dielectrics are those dielectrics that have a dielectric constant that is greater than silicon oxide. Representative high k dielectrics that are useful as a gate insulating material include metal oxides such as, for example, zirconium oxide and hafnium oxide. The use of high k dielectrics as the gate insulating film of a metal oxide semiconductor field effect transistor (MOSFET) can successfully reduce the equivalent silicon oxide thickness in an electrical sense, even if the physical thickness thereof is increased relative to a silicon oxide gate dielectric. Hence, high k dielectric films when used as a gate insulating film are stable both in a physical sense and in a structural sense. This makes it possible to increase the MOS capacitance for improved MOSFET characteristics, and to reduce gate leakage current as compared with the conventional devices in which silicon oxide was used as the gate insulating film.

Although high k dielectrics provide improvements over conventionally used silicon oxide as the gate insulating film in a FET device, the use of the same is not without problems. For example, FET devices including high k gate dielectrics exhibit a non-ideal threshold voltage when the device is used.

In the prior art, various techniques including, for example, forming a threshold voltage adjusting layer interposed between the high k gate dielectric and the gate electrode have been proposed. Although such threshold voltage adjusting techniques have been proposed for a device with fixed critical dimensions (i.e., channel length of L and channel width W), large variations of threshold voltage along critical dimensions, including Vt-L and Vt-W are still observed. The term "Vt-L" denotes the threshold voltage along the channel length, while the term "Vt-W" denotes the threshold voltage along the channel width. It's critical to reduce Vt variations of MOSFETs in a circuit, since there is always actual variations of a device designed at the same design dimensions.

In view of the above, there is still a need for providing a method that forms FET devices, including MOSFET and CMOS (complementary metal oxide semiconductor) devices, in which the variation of threshold voltage within the devices is minimized.

BRIEF SUMMARY

In one embodiment, a method of fabricating a semiconductor structure having a controlled threshold voltage is provided that includes providing at least one patterned gate stack in at least one device region of a semiconductor substrate. In this embodiment, the at least one patterned gate stack includes from bottom to top, a patterned gate dielectric material having a dielectric constant of greater than silicon oxide and a patterned gate conductor. An optional patterned threshold voltage adjusting layer may also be present between the patterned gate dielectric and the patterned gate conductor. Next, a conformal nitride-containing liner is formed on at least exposed sidewalls of the patterned gate dielectric material by utilizing a low temperature nitridation process that is performed at a temperature of less than 500° C. in a nitrogen-containing ambient.

In another embodiment, a method of fabricating a CMOS structure having a controlled threshold voltage is provided. This embodiment of the invention includes providing a first patterned gate stack in a first device region of a semiconductor substrate, and a second patterned gate stack in a second device region of the semiconductor substrate. The first patterned gate stack includes from bottom to top, a patterned gate dielectric material having a dielectric constant of greater than silicon oxide, optionally a patterned first threshold voltage adjusting layer, and a patterned gate conductor and the second patterned gate stack includes from bottom to top, a patterned gate dielectric material having a dielectric constant of greater than silicon oxide, optionally a patterned second threshold voltage adjusting layer, and a patterned gate conductor. In this embodiment, and when present, the optional first patterned threshold voltage adjusting layer is a different threshold voltage adjusting type of material as compared to the optional second patterned threshold voltage adjusting layer. Next, a conformal nitride-containing liner is formed on at least exposed sidewalls of the patterned gate dielectric material in both device regions by a low temperature nitridation process that is performed at a temperature of less than 500° C. in a nitrogen-containing ambient.

In yet another embodiment of the invention, a method of forming a CMOS structure is provided that includes providing a first patterned gate stack in a first device region of a semiconductor substrate, and a second patterned gate stack in a second device region of the semiconductor substrate. The first patterned gate stack includes from bottom to top, a patterned gate dielectric material having a dielectric constant of greater than silicon oxide, optionally a patterned first threshold voltage adjusting layer, and a patterned gate conductor and the second patterned gate stack includes from bottom to top, a patterned gate dielectric material having a dielectric constant of greater than silicon oxide, optionally a patterned second threshold voltage adjusting layer, and a patterned gate conductor. In this embodiment, the optional first patterned threshold voltage adjusting layer is a different threshold voltage adjusting type of material as compared to the optional second patterned threshold voltage adjusting layer. Next, an embedded semiconductor material having a different lattice constant than the semiconductor substrate is formed within the semiconductor substrate at a footprint of one of the patterned gate stacks and thereafter sidewalls of the patterned gate dielectric material in each of the patterned gate stacks is selectively exposed. A conformal nitride-containing liner is then formed on at least the exposed sidewalls of the patterned gate dielectric material in both device regions by a low temperature nitridation process that is performed at a temperature of less than 500° C. in a nitrogen-containing ambient.

In a further embodiment of the invention, a semiconductor structure is provided that has a controlled threshold voltage. The semiconductor structure of this embodiment includes at least one patterned gate stack in at least one device region of a semiconductor substrate. The at least one patterned gate stack includes from bottom to top, a patterned gate dielectric material having a dielectric constant of greater than silicon oxide, optionally a patterned threshold voltage adjusting layer, and a patterned gate conductor. The structure of this embodiment further includes a conformal nitride-containing liner located on at least exposed sidewalls of the patterned gate dielectric material, the conformal nitride-containing liner having a thickness of from 0.5 nm to 50 nm.

In an even further embodiment of the invention, a CMOS structure is provided that includes a first patterned gate stack in a first device region of a semiconductor substrate, and a second patterned gate stack in a second device region of the semiconductor substrate. The first patterned gate stack includes from bottom to top, a patterned gate dielectric material having a dielectric constant of greater than silicon oxide, optionally a patterned first threshold voltage adjusting layer, and a patterned gate conductor and the second patterned gate stack includes from bottom to top, a patterned gate dielectric material having a dielectric constant of greater than silicon oxide, optionally a patterned second threshold voltage adjusting layer, and a patterned gate conductor. In this embodiment, and when present, the optional first patterned threshold voltage adjusting layer is a different threshold voltage adjusting type of material as compared to the optional second patterned threshold voltage adjusting layer. In this embodiment, the structure also includes a conformal nitride-containing liner located on at least exposed sidewalls of the patterned gate dielectric material in both device regions, the conformal nitride-containing liner having a thickness of from 0.5 nm to 50 nm.

DETAILED DESCRIPTION

The present invention, which provides semiconductor structures having improved threshold voltage control, will now be described in greater detail by referring to the following discussion and drawings that accompany the present application. It is noted that the drawings mentioned above are provided for illustrative purposes only and, as such, the drawings are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 1:
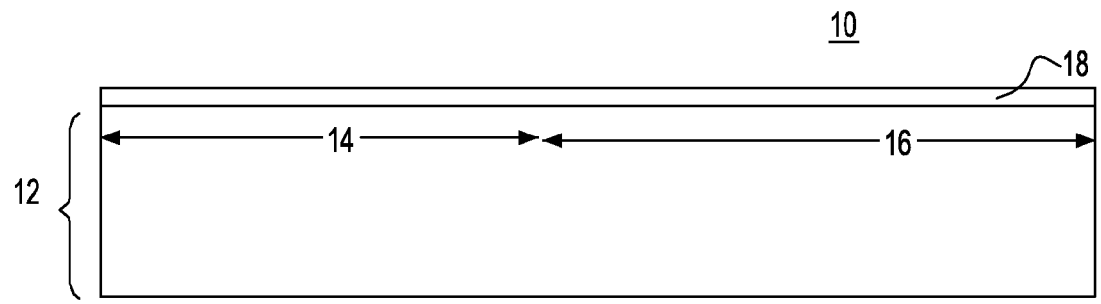
FIG. 1 is a pictorial representation (through a cross sectional view) depicting an initial structure including a high k gate dielectric located atop a substrate that can be employed in a first embodiment of the invention.

Reference is first made to FIG. 1 which shows an initial structure 10 that can be employed in one embodiment of the present invention. Specifically, the initial structure 10 includes a semiconductor substrate 12 including a first device region 14 and a second device region 16. Although two devices regions are described and illustrated, the present invention can be employed in embodiments wherein a single device region is present, or in embodiments in which a plurality of device regions are present.

The initial structure 10 illustrated in FIG. 1 also includes a high k gate dielectric 18 located atop the semiconductor substrate 12 in both the first device region 14 and the second device region 16. The first device region 14 is either an nFET device region or a pFET device region, while the second device region 16 is the other of an nFET device region or a pFET device region.

The semiconductor substrate 12 illustrated in FIG. 1 is comprised of any semiconductor material including, but not limited to Si, Ge, SiGe, SiC, SiGeC, GaAs, GaN, InAs, InP and all other III/V or II/VI compound semiconductors. Semiconductor substrate 12 may also comprise an organic semiconductor or a layered semiconductor such as Si/SiGe, a silicon-on-insulator (SOI), a SiGe-on-insulator (SGOI) or a germanium-on-insulator (GOI). In some embodiments of the present invention, it is preferred that the semiconductor substrate 12 be composed of a Si-containing semiconductor material, i.e., a semiconductor material that includes silicon. The semiconductor substrate 12 may be doped, undoped or contain doped and undoped regions therein. The semiconductor substrate 12 may include a single crystal orientation or it may include at least two coplanar surface regions that have different crystal orientations (the latter substrate is referred to in the art as a hybrid substrate). When a hybrid substrate is employed, an nFET is typically formed on a (100)crystal surface, while a pFET is typically formed on a (110) crystal plane. The hybrid substrate can be formed by techniques that are well known in the art. See, for example, co-owned U.S. Pat. No. 7,329,923, U.S. Publication No. 20050116290, dated Jun. 2, 2005 and U.S. Pat. No. 7,023,055, the entire contents of each are incorporated herein by reference.

The semiconductor substrate 12 may also include a first doped (n- or p-) region, and a second doped (n- or p-) region. For clarity, the doped regions are not specifically shown in any of the drawings of the present application. The first doped region and the second doped region may be the same, or they may have different conductivities and/or doping concentrations. These doped regions are known as "wells" and they are formed utilizing conventional ion implantation processes.

At least one isolation region (not shown) is then typically formed into the semiconductor substrate 12. The at least one isolation region may be a trench isolation region or a field oxide isolation region. The trench isolation region is formed utilizing a conventional trench isolation process well known to those skilled in the art. For example, lithography, etching and filling of the trench with a trench dielectric may be used in forming the trench isolation region. Optionally, a liner may be formed in the trench prior to trench fill, a densification step may be performed after the trench fill and a planarization process may follow the trench fill as well. The field oxide may be formed utilizing a so-called local oxidation of silicon process. Note that the at least one isolation region provides isolation between neighboring gate regions, typically required when the neighboring gates have opposite conductivities, i.e., nFETs and pFETs. The isolation region is typically present between the various device regions of the substrate, i.e., between first device region 14 and second device region 16.

After processing the semiconductor substrate 12, a chemox layer (not shown) is optionally formed on the surface of the semiconductor substrate 12. The optional chemox layer is formed utilizing a conventional growing technique that is well known to those skilled in the art including, for example, oxidation or oxynitridation. In some embodiments, the chemox layer is formed by a wet chemical oxidation process. When the substrate 12 is a Si-containing semiconductor, the chemox layer is comprised of silicon oxide, silicon oxynitride or a nitrided silicon oxide. When the semiconductor substrate 12 is other than a Si-containing semiconductor, the chemox layer may comprise a semiconducting oxide, a semiconducting oxynitride or a nitrided semiconducting oxide. The thickness of the chemox layer is typically from 0.5 nm to 1.5 nm, with a thickness from 0.8 nm to 1 nm being more typical. The thickness, however, may be different after processing at higher temperatures, which are usually required during FET or CMOS fabrication.

High k gate dielectric 18 is then formed atop the semiconductor substrate 12. In some embodiments, and as illustrated, the high k gate dielectric 18 is formed directly on a surface of the semiconductor substrate 12. In other embodiments, the high gate dielectric 18 is formed on a surface of the chemox layer described above.

The high k gate dielectric 18 employed includes any dielectric metal oxide having a dielectric constant that is greater than the dielectric constant of silicon oxide, e.g., 3.9. Typically, the high k gate dielectric 18 that is employed in has a dielectric constant greater than 4.0, with a dielectric constant of greater than 8.0 being even more typical. Exemplary high k dielectric materials include, but are not limited to $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof Multilayered stacks of these high k materials can also be employed as the high k gate dielectric 18. Each value of x is independently from 0.5 to 3 and each value of y is independently from 0 to 2.

The thickness of the high k gate dielectric 18 may vary depending on the technique used to form the same. Typically, however, the high k gate dielectric 18 has a thickness from 0.5 nm to 10 nm, with a thickness from 1.0 nm to 5 nm being even more typical. The high k gate dielectric 18 employed may have an effective oxide thickness on the order of, or less than, 1 nm.

The high k gate dielectric 18 is formed by methods well known in the art including, for example, chemical vapor deposition (CVD), physical vapor deposition (PVD), molecular beam deposition (MBD), pulsed laser deposition (PLD), liquid source misted chemical deposition (LSMCD), atomic layer deposition (ALD), and other like deposition processes.

Figure 2:
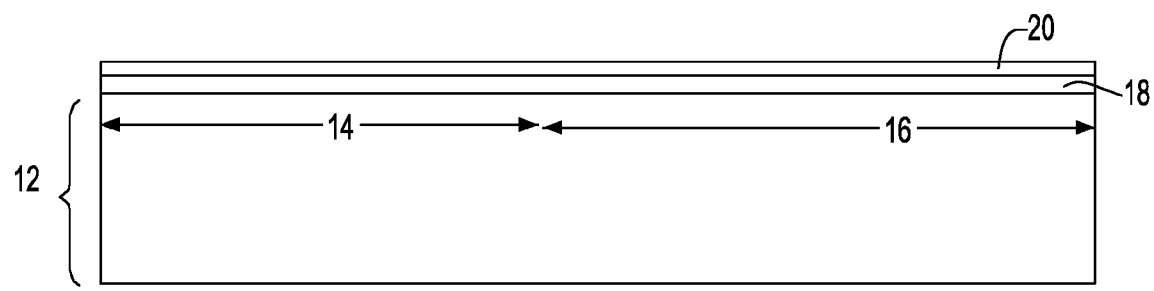
FIG. 2 is a pictorial representation (through a cross sectional view) depicting the structure of FIG. 1 after forming an optional first threshold voltage adjusting layer atop the high k gate dielectric.

Reference is now made to FIG. 2, which illustrates the initial structure of FIG. 1 after forming an optional first threshold voltage adjusting layer 20 atop the high k gate dielectric 18. The term "threshold voltage adjusting layer" as used throughout the instant application denotes a material that moves the threshold voltage of a gate stack towards either an nFET or pFET band edge. The optional first threshold voltage adjusting layer 20 employed may include an nFET threshold voltage adjusting material or a pFET threshold voltage adjusting material. The type of threshold voltage adjusting material employed in this step is dependent on which conductivity type device, e.g., nFET or pFET, is being fabricated.

One example of an nFET threshold voltage adjusting material that can be used as the optional first threshold voltage adjusting layer 20 is a rare earth metal-containing material that comprises an oxide or nitride of at least one element from Group IIIB of the Periodic Table of Elements (CAS version) including, for example, La, Ce, Pr, Nd, Pm, Sm, Eu, Ga, Tb, Dy, Ho, Er, Tm, Yb, Lu or mixtures thereof. Preferably, the rare earth metal-containing material comprises an oxide of La, Ce, Y, Sm, Er and/or Tb, with $La_2O_3$ being more preferred.

The rare earth metal-containing material is formed utilizing a conventional deposition process including, for example, evaporation, molecular beam deposition, metalorgano chemical vapor deposition (MOCVD), atomic layer deposition (ALD), physical vapor deposition (PVD) and other like deposition processes. In one embodiment of the present invention, the rare earth metal-containing material is formed by placing the structure including the high k gate dielectric into the load-lock of a molecular beam deposition chamber, followed by pumping this chamber down to the range of $10^{-5}$ Torr to $10^{-8}$ Torr. After these steps, the structure is inserted, without breaking vacuum into the growth chamber where the rare earth metal-containing material such as La oxide is deposited by directing atomic/molecular beams of the rare earth metal and oxygen or nitrogen onto the structure's surface. Specifically, because of the low pressure of the chamber, the released atomic/molecular species are beamlike and are not scattered prior to arriving at the structure. A substrate temperature of about 300° C. is used. In the case of $La_2O_3$ deposition, the La evaporation cell is held in the temperature range of 1400° C. to 1700° C., and a flow rate of 1 sccm to 3 sccm of molecular oxygen is used. Alternatively, atomic or excited oxygen may be used as well, and this can be created by passing the oxygen through a radio frequency source excited in the range of 50 Watts to 600 Watts. During the deposition, the pressure within the chamber can be in the range from $1\times10^{-5}$ Torr to $8\times10^{-5}$ Torr, and the La oxide growth rate can be in the range from 0.1 nm per minute to 2 nm per minute, with a range from 0.5 nm per minute to 1.5 nm per minute being more typical.

Another example of an nFET threshold voltage adjusting material that can be employed as the optional first threshold voltage adjusting layer 20 is an alkaline earth metal-containing material that comprises a compound having the formula MAX wherein M is an alkaline earth metal (Be, Mg, Ca, Sr, and/or Ba), A is one of O, S and a halide, and x is 1 or 2. Alkaline earth metal-containing compounds that include a mixture of alkaline earth metals and/or a mixture of anions, such as an oxychloride can also be used as an nFET threshold voltage adjusting material. Examples of alkaline earth metal-containing compounds that can be used include, but are not limited to MgO, MgS, $MgF_2$, $MgCl_2$, $MgBr_2$, $MgI_2$, CaO, CaS, $CaF_2$, $CaCl_2$, $CaBr_2$, $CaI_2$, SrO, SrS, $SrF_2$, $SrCl_2$, $SrBr_2$, $SrI_2$, BaO, BaS, $BaF_2$, $BaCl_2$, $BaBr_2$, and $BaI_2$. In one preferred embodiment of the present invention, the alkaline earth metal-containing compound includes Mg. MgO is a highly preferred alkaline earth metal-containing material employed in one embodiment of the present invention.

The alkaline earth metal-containing material is formed utilizing a conventional deposition process including, for example, sputtering from a target, reactive sputtering of an alkaline earth metal under oxygen plasma conditions, electroplating, evaporation, molecular beam deposition, MOCVD, ALD, PVD and other like deposition processes.

In addition to nFET threshold voltage adjusting materials, the optional first threshold voltage adjusting layer 20 can alternatively be a pFET threshold voltage adjusting material. Examples of pFET threshold voltage adjusting materials include Al (and its compounds that are non-conductive such as, for example $Al_2O_3$), Ge (and its compounds that are non-conductive such as, for example $GeO_2$), and non-conductive compounds of Ti and Ta such as, $TiO_2$ and $Ta_2O_5$ respectively.

The nFET threshold voltage adjusting materials are formed utilizing conventional deposition processes well known to those skilled in the art including, but not limited to chemical vapor deposition (CVD), plasma enhanced chemical vapor deposition (PECVD), chemical solution deposition, atomic layer deposition (ALD), physical vapor deposition (PVD), sputtering and plating.

Notwithstanding the type of material used as the optional first threshold voltage adjusting layer 20, the optional first threshold voltage adjusting layer 20, when present, has a thickness from 0.1 nm to 5.0 nm, with a thickness from 1.0 nm to 3.0 nm being even more typical.

Figure 3:
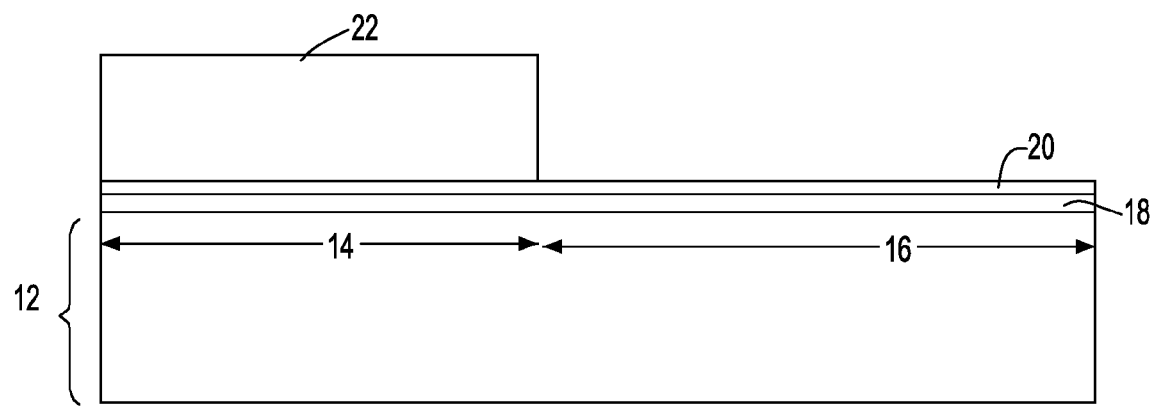
FIG. 3 is a pictorial representation (through a cross sectional view) depicting the structure of FIG. 2 after formation of a patterned mask atop a portion of the optional first threshold voltage adjusting layer within one device region of the substrate.
Figure 4:
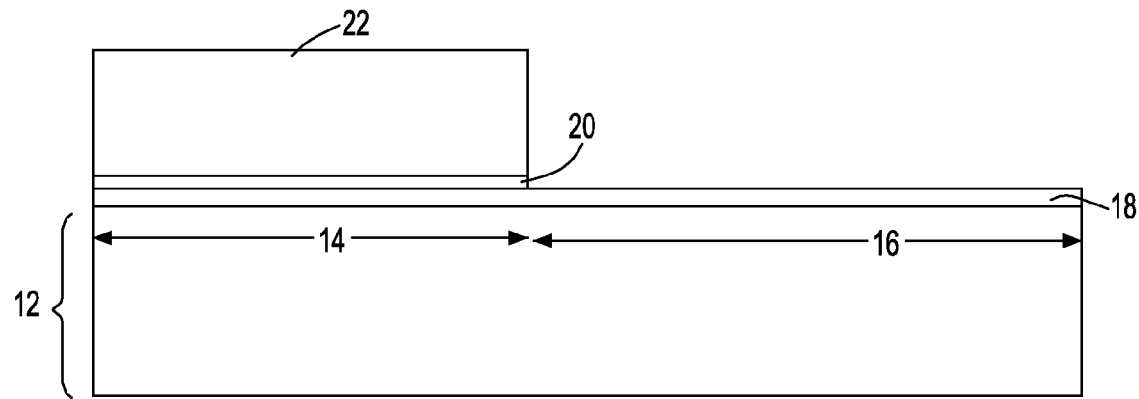
FIG. 4 is a pictorial representation (through a cross sectional view) depicting the structure of FIG. 3 after removing unexposed portions of the optional first threshold voltage adjusting layer from the device region not including the patterned mask.

Next, and as is illustrated in FIG. 3, a first patterned mask 22 is formed on the surface of the optional first threshold voltage adjusting layer 20 protecting one of the device regions, while leaving the other device region unprotected. In the embodiment illustrated, the first patterned mask 22 is protecting a portion of the optional first threshold voltage adjusting layer 20 that is located in the first device region 14, while another portion of the optional threshold voltage adjusting layer 20 in the second device region 16 is left unprotected.

The first patterned mask 22 employed may include a hard mask, a photoresist or a multi-layered stack thereof. In one embodiment, the first patterned mask 22 is a photoresist. In another embodiment, the first patterned mask 22 is a hard mask selected from a semiconductor oxide, semiconductor nitride, or semiconductor oxynitride.

The first patterned mask 22 is formed utilizing conventional techniques including deposition, photolithography and optionally etching, that are well known to those skilled in the art. In particular, and when the patterned mask is comprised solely of a photoresist, a blanket layer of photoresist material is first applied to the upper surface of the first threshold voltage adjusting layer 20 utilizing a conventional deposition process such as, for example, spin-on coating, evaporation, chemical vapor deposition (CVD), and plasma enhanced chemical vapor deposition (PECVD). After deposition of the blanket layer of photoresist, the blanket layer is patterned by lithography including exposing the photoresist to a desired pattern of radiation and then developing the exposed resist utilizing a conventional resist developer.

When a hard mask is used as the first patterned mask 22, a blanket layer of hard mask material is first deposited on the surface of the optional first threshold voltage adjusting layer 20 utilizing a conventional deposition process including, for example, CVD, PECVD, chemical solution deposition, evaporation, atomic layer deposition (ALD), and physical vapor deposition (PVD). Next, a blanket layer of photoresist is applied atop the blanket layer of hard mask material, and thereafter lithography is used to pattern the photoresist. The pattern within the patterned resist is then transferred to the underlying hard mask material utilizing one of dry etching (reactive ion etching, ion beam etching, plasma etching, or laser ablation) and chemical wet etching. The patterned resist is optionally removed from the structure following the pattern transfer step utilizing a conventional resist stripping process well known to those skilled in the art. Alternatively, the patterned resist can remain atop the pattern hard mask and form a multilayered patterned mask of the invention.

Figure 5:
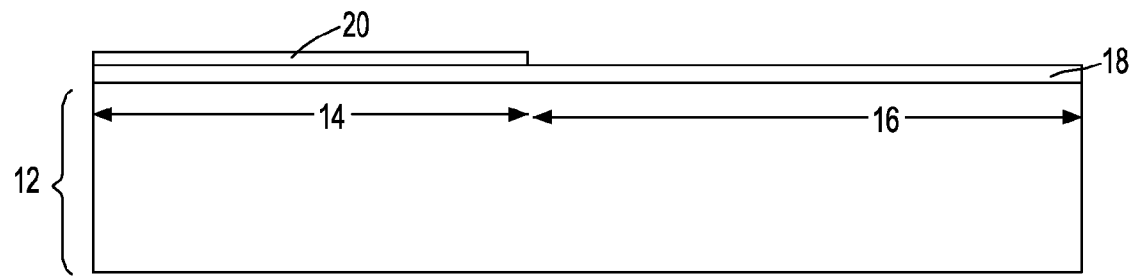
FIG. 5 is a pictorial representation (through a cross sectional view) depicting the structure of FIG. 4 after removing the patterned mask therefrom.

Next, the structure shown in FIG. 3 is subjected to an etching step that selectively removes the exposed portions of the optional first threshold voltage adjusting layer 20 from one of the device regions that is not protected by the first patterned mask 22. In the embodiment illustrated, the optional first threshold voltage adjusting layer 20 is removed from the second device region 16. Note that after removing the optional threshold voltage adjusting layer 20 from the non-protected device region, an upper surface of the underlying high k gate dielectric 18 is exposed. The resultant structure is shown in FIG. 5. Typically, the exposed portion of the optional first threshold adjusting layer 20 is removed utilizing a dry etching step such as, for example, reactive ion etching, ion beam etching, plasma etching and laser ablation. In one embodiment of the invention, a plasma etching process is used to strip the exposed optional first threshold voltage adjusting layer 20 from the structure. When the first patterned mask 22 includes a resist, this etching step can also simultaneously remove the patterned resist. When the patterned mask is a hard mask, a separate etching step is performed that removes the first patterned mask from the structure. The resultant structure after first hard mask removal is shown, for example, in FIG. 5.

Next, an optional second threshold voltage adjusting layer is applied to the structure shown in FIG. 5. The optional second threshold voltage adjusting layer is the other of the nFET or pFET threshold voltage adjusting material not employed as the optional first threshold voltage adjusting layer 20. The optional second threshold voltage adjusting layer is applied utilizing one of the techniques described above in respect to the optional first threshold voltage adjusting layer 20. Next, a second patterned mask (not shown) is formed over the device region not including the remaining optional first threshold voltage adjusting layer 20. In the illustrated example, the second patterned resist is formed atop the second device region 16.

Figure 6:
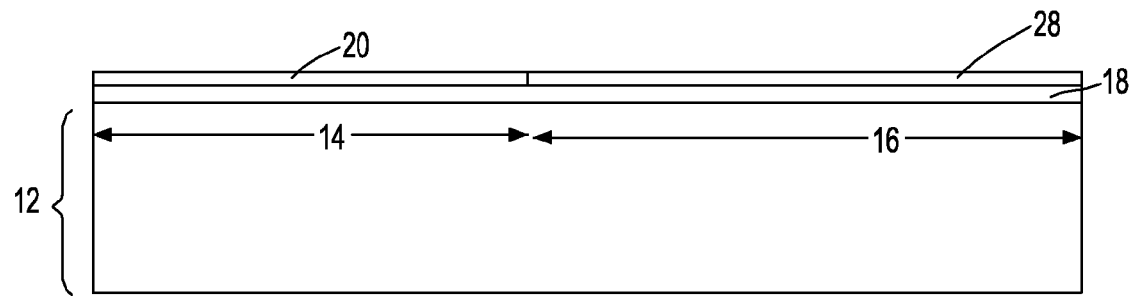
FIG. 6 is a pictorial representation (through a cross sectional view) depicting the structure of FIG. 5 after forming an optional second threshold adjusting layer within the device region not including the first threshold voltage adjusting layer.

The second patterned mask can include one of the mask materials mentioned above for the first patterned mask and the second patterned mask can be formed utilizing the processing described above in forming the first patterned mask. After application of the second patterned mask, the exposed portion of the optional second threshold voltage adjusting layer is then removed utilizing another etching process. After removing the exposed optional second threshold voltage adjusting layer from the device region including the remaining portion of the optional first threshold voltage adjusting layer 20, the second patterned mask is removed as described above providing the structure shown in FIG. 6. In FIG. 6, the remaining optional second threshold voltage adjusting layer is denoted by reference numeral 28. As shown, the remaining optional first threshold voltage adjusting layer 20 laterally abuts the remaining optional second threshold voltage adjusting layer 28. When the optional first and second threshold voltage adjusting layers are not present, the processing shown in FIGS. 2-6 can be omitted. In some embodiments, the optional first and second threshold voltage layers are present. In other embodiments, the optional first and second threshold voltage adjusting layers are not present.

It is noted that in embodiments in which a single device region is present, the application of the optional second threshold voltage adjusting layer and second patterned mask can be omitted.

A conductive material is then formed atop the remaining optional first threshold voltage adjusting layer 20 and the remaining optional second threshold voltage adjusting layer 28. If the optional first and second threshold voltage layers are not present, a conductive material is formed atop gate dielectric 18. Optionally, a hard mask material can be formed atop the conductive material. The conductive material that is employed may comprise any conductive material including but not limited to polycrystalline silicon, polycrystalline silicon germanium, an elemental metal, (e.g., tungsten, titanium, tantalum, aluminum, nickel, ruthenium, palladium and platinum), an alloy of at least one elemental metal, an elemental metal nitride (e.g., tungsten nitride, aluminum nitride, and titanium nitride), an elemental metal silicide (e.g., tungsten silicide, nickel silicide, and titanium silicide) and multilayers thereof. Preferably, the conductive material that is formed atop the remaining threshold voltage adjusting layers includes at least an elemental metal. In one embodiment of the present invention, a single conductive material layer is formed. In another embodiment of the present invention, a first conductive material layer and a second conductive material layer are formed.

The conductive material is formed utilizing a conventional deposition process including, for example, chemical vapor deposition (CVD), plasma enhanced chemical vapor deposition (PECVD), evaporation, physical vapor deposition (PVD), sputtering, chemical solution deposition, atomic layer deposition (ALD) and other liked deposition processes. When Si- containing materials are used as the conductive material, the Si-containing materials can be doped within an appropriate impurity by utilizing either an in-situ doping deposition process or by utilizing deposition, followed by a step such as ion implantation in which the appropriate impurity is introduced into the Si-containing material. When a metal silicide is formed, a conventional silicidation process is employed.

The as deposited conductive material typically has a thickness from 10 nm to 1000 nm, with a thickness from 50 nm to 500 nm being even more typical.

After forming the conductive material atop the remaining optional first and second threshold voltage adjusting layers, an optional hard mask material can be formed atop the conductive material. The optional hard mask material includes an oxide, a nitride, an oxynitride or any combination thereof including multilayered stacks. When present the optional hard mask material is formed utilizing a conventional deposition process well known to those skilled in the art including, for example, CVD and PECVD. Alternatively, the optional hard mask material is formed by a thermal process such as, for example, oxidation and/or nitridation.

The thickness of the optional hard mask material may vary depending on the exact hard mask material employed as well as the process that is used in forming the same. Typically, the hard mask material has a thickness from 5 nm to 200 nm, with a thickness from 10 nm to 50 nm being even more typical. The hard mask material is typically employed when the conductive material is a Si-containing material such as polysilicon or SiGe.

After forming the conductive material and optionally the hard mask material, the material stack including the same is then patterned by conventional lithography and etching to form a first patterned gate stack 30 in the first device region 14 and a second patterned gate stack 32 in the second device region 16. The first patterned gate stack 30 includes, from bottom to top, patterned high k gate dielectric 18', optional patterned first threshold voltage adjusting layer 20', patterned conductive conductor 27 and optionally patterned hard mask 29. The second patterned gate stack 32 includes, from bottom to top, patterned high k gate dielectric 18', optional patterned second threshold voltage adjusting layer 28', patterned gate conductor 27 and optional patterned hard mask 29. Note that the patterned gate conductor in both device regions is one of the conductive materials described above. The structure including the patterned gate stacks is shown in FIG. 7.

Figure 7:
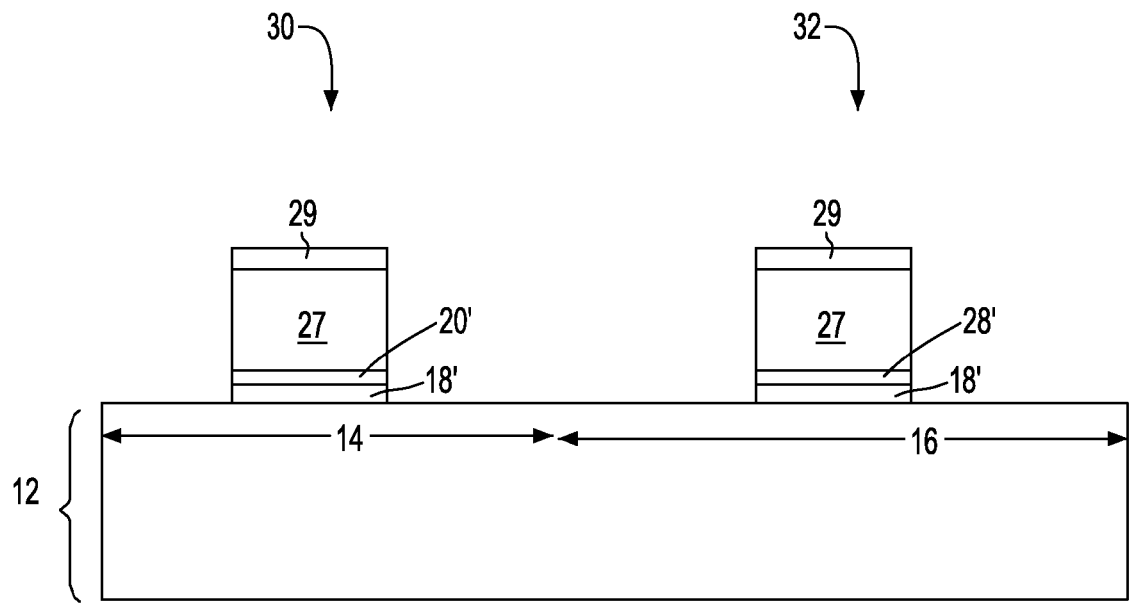
FIG. 7 is a pictorial representation (through a cross sectional view) depicting the structure of FIG. 6 after formation of patterned gate stacks including an optional hard mask located atop a gate conductor material.

It should be noted that variations of the method described above can also be used to form the structure shown in FIG. 7. These variations of forming the structure shown in FIG. 7 are also contemplated and can be used herein as well.

In one embodiment, the patterned gate stacks, e.g., first patterned gate stack 30 and second patterned gate stack 32, are now subjected to a low temperature nitridation process to form a conformal nitride-containing liner 34 on at least the sidewalls of the patterned high k gate dielectric (hereinafter patterned gate dielectric material) 18'; in some embodiments the conformal nitride-containing liner 34 can also extend onto other exposed sidewalls of the patterned gate stacks including atop the exposed upper horizontal surface of the patterned gate stacks. The structure including the conformal nitride-containing liner 34 is shown, for example, in FIG. 8. The conformal nitride-containing liner 34 is a thin layer typically having a thickness from 0.5 nm to 50 nm, with a thickness from 1 nm to 10 nm being even more typical.

The low temperature nitridation process that is employed in forming conformal nitride-containing liner 34 is carried out in the presence of a nitrogen-containing ambient. Nitrogen-containing ambients that can be used in forming the conformal nitride-containing liner 34 include, but are not limited to $N_2$, $NH_3$, $NH_4$, NO, $NO_2$, $SiH_4$ and a mixture thereof. In some embodiments of the present invention, the nitrogen-containing ambient can be used neat. In other embodiments of the present invention, the nitrogen-containing ambient is admixed with an inert gas including, for example, one of He, Ar and Ne. When an inert gas is admixed with the nitrogen-containing ambient, the nitrogen-containing ambient is present in the admixture in a concentration from 0.1-100%. In one embodiment, $N_2$ is used as the nitrogen-containing gas.

The low temperature nitridation process is typically performed utilizing a plasma that contains the above mentioned nitrogen-containing ambients. The low temperature nitridation process is also performed at a temperature that has little or no impact on the patterned gate stack. Specifically, the low temperature nitridation process is performed at a temperature of less than 500° C., with a temperature from 100° C. to 300° C. being even more preferred. Low temperature nitridation within the aforementioned temperature range has little or no impact on the patterned gate stacks, while temperatures above the aforementioned range would negatively impact the patterned gate stack by variation of threshold voltage Vt.

It is observe that the presence of the thin conformal nitride-containing liner 34 on the sidewalls of the patterned gate stacks, e.g., 30 and 32, helps to minimize the threshold variation within the FET device. Moreover, the thin conformal nitride-containing liner 34 passivates the exposed gate stack from any potential reaction with an ambient during following processes. Any potential reactions between the gate stack with the ambient could cause variation of the threshold voltage Vt.

In some embodiments of the invention, a single low temperature nitridation exposure is performed, while in other embodiments multiple low temperature nitridation exposures are performed.

Further CMOS processing steps can now be employed in fabricating at least one FET device. The further CMOS processing steps include, but are not limited to, optional gate sidewall passivation, optional spacer formation, source and drain extension formation, and source and drain region formation.

FIGS. 1-8 described above illustrate one embodiment of the present invention in which low temperature nitridation is performed after formation of the patterned gate stacks. It is noted that improvements in threshold voltage control were not exhibited if low temperature nitridation was performed prior to patterned gate stack formation.

Figure 9:
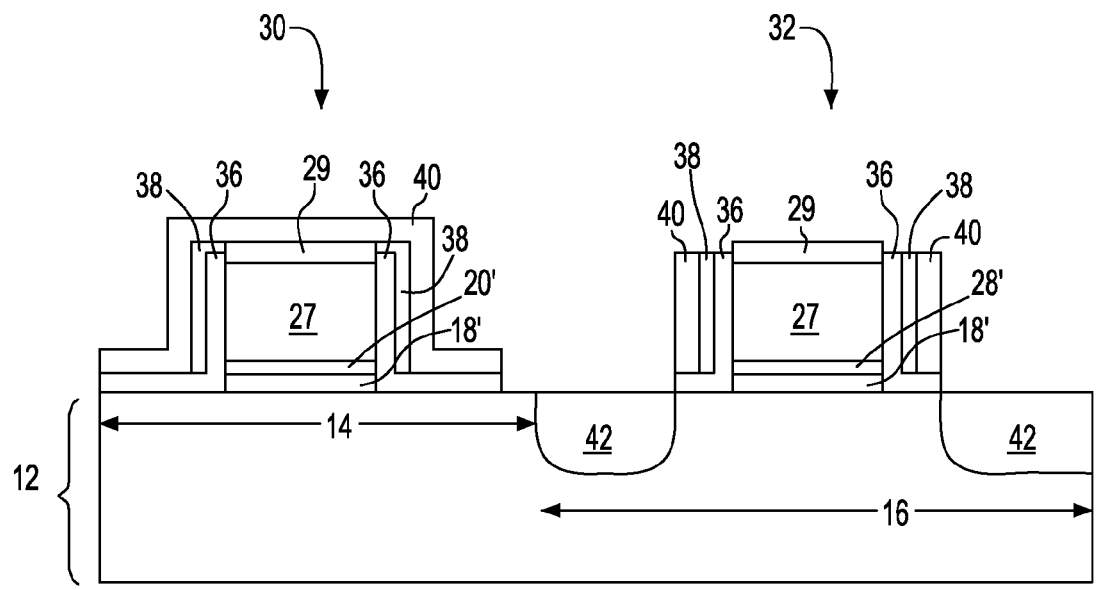
FIG. 9 is a pictorial representation (through a cross sectional view) depicting the structure of FIG. 7 after formation of an embedded semiconductor material within the substrate at the footprint of at least one of the patterned gate stacks in accordance with a second embodiment of the invention.
Figure 10:
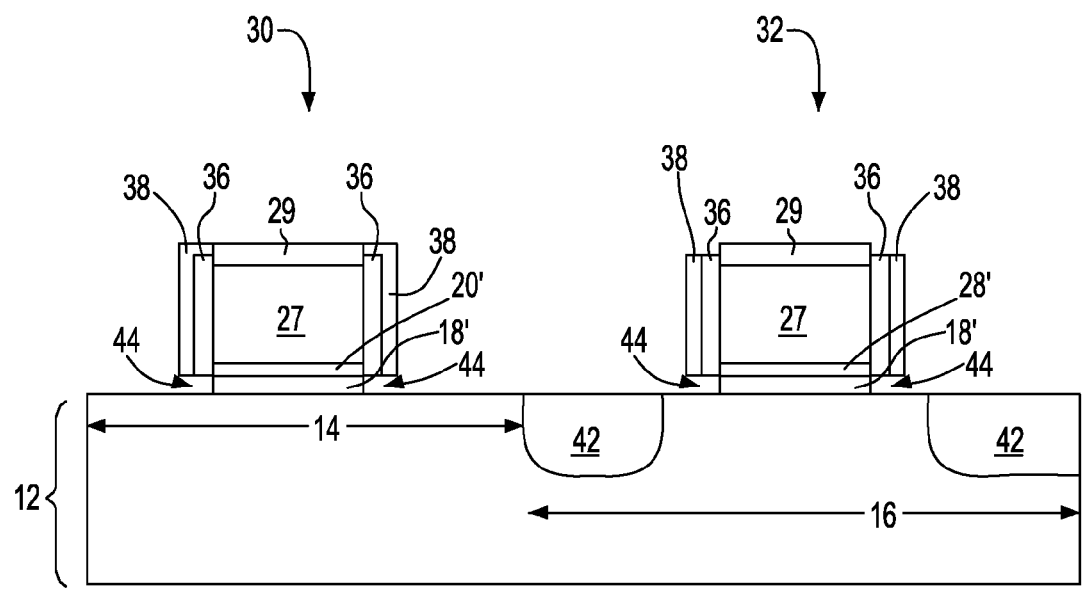
FIG. 10 is a pictorial representation (through a cross sectional view) depicting the structure of FIG. 9 after exposing sidewalls of the high k gate dielectric present in each of the patterned gate stacks.
Figure 11:
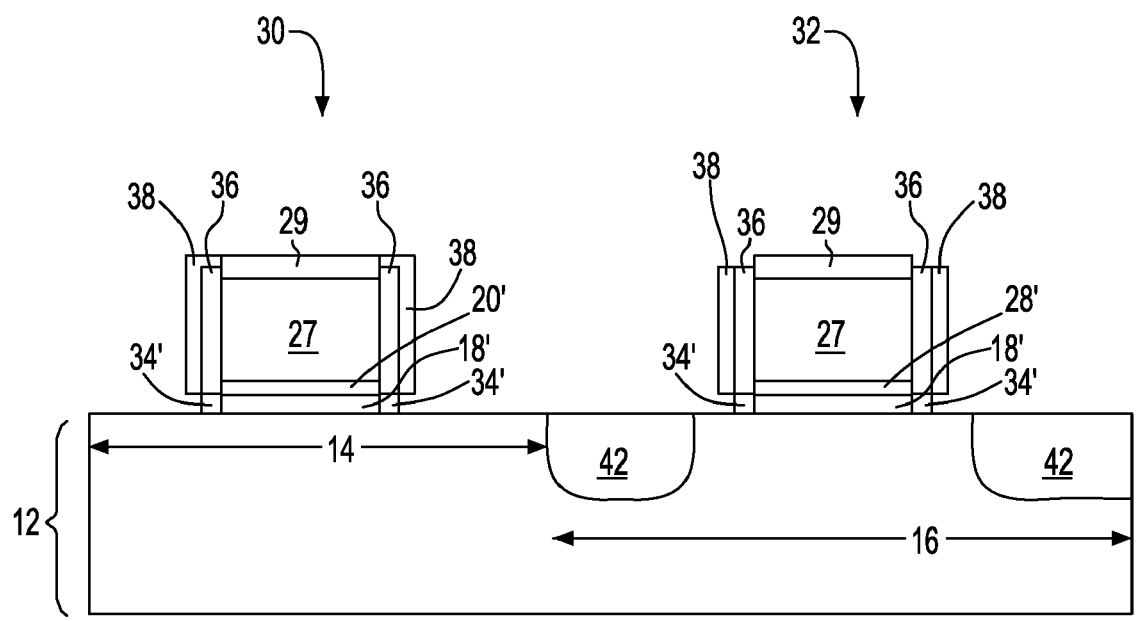
FIG. 11 is a pictorial representation (through a cross sectional view) depicting the structure of FIG. 10 after performing a low temperature nitridation process to the exposed sidewalls of the high k gate dielectric that is present in each of the patterned gate stacks.

The following description, which refers to FIGS. 9-11, illustrates another embodiment of the invention in which a low temperature nitridation process is performed after gate patterning and formation of an embedded semiconductor material within the substrate at the footprint of at least one of the patterned gate stacks. The embedded semiconductor material employed in this embodiment of the present invention has a different lattice constant that substrate 10.

Figure 8:
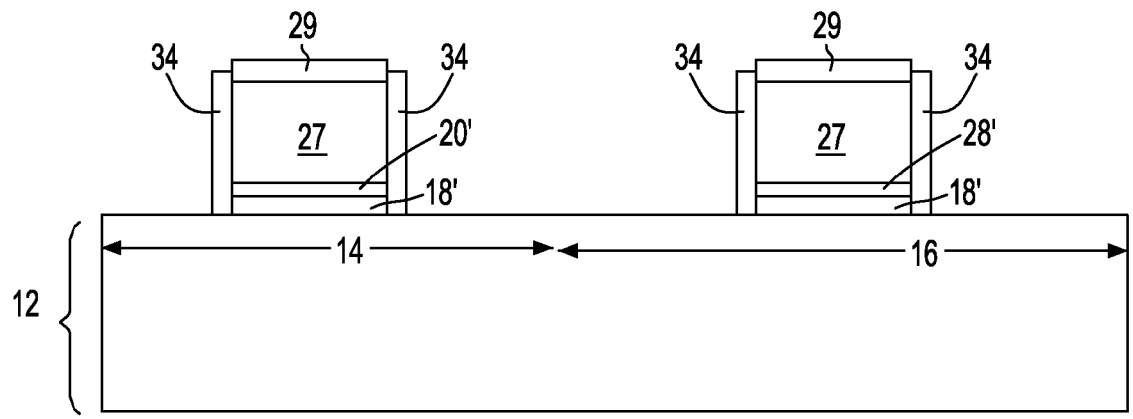
FIG. 8 is a pictorial representation (through a cross sectional view) depicting the structure of FIG. 7 after performing a low temperature nitridation process to each of the patterned gate stacks.

This embodiment begins by first providing the structure shown in either FIG. 7 or FIG. 8. For clarity, the following description and drawings assume that the structure shown in FIG. 7 is employed. After providing that structure, an inner liner 36 is then formed on the exposed sidewalls of the first patterned gate stack 30 and the second patterned gate stack 32 by deposition and etching. The inner liner 36, which is L-shaped, is comprised of a conformal nitride-containing material such as a nitride, oxynitride, or a multilayered stack thereof. The thickness of the inner liner 36 is typically from 1 nm to 100 nm, with a thickness from 10 nm to 50 nm being more typical.

After forming the inner liner 36, a low temperature oxide liner (LTO) 38 is formed utilizing a conventional low temperature (less than 500° C.) deposition process and etching. The LTO liner 38, which lies on an exposed horizontal surface of inner liner 36, may comprise an oxide, oxynitride or a multilayered stack thereof. The thickness of the LTO liner 38 is typically from 0 nm to 100 nm, with a thickness from 5 nm to 20 nm being more typical.

A semiconductor material block mask 40 is then formed by conventional deposition and thereafter patterned by lithography and etching. As is shown in FIG. 9, for example, one of the device regions, e.g., the first device region 14, is protected by the semiconductor material block mask 40, while the semiconductor substrate within the other device region, e.g., the second device region 16, is exposed. The semiconductor material block mask 40 is comprised of an oxide, nitride, oxynitride or any multilayered stack thereof. As shown, portions of the semiconductor substrate 12 at the footprint of the second patterned gate stack 32 within the second device region 16 is exposed.

An etching process that selectively removes a portion of the semiconductor substrate 12 is then performed to form a recess region within the exposed surface of the substrate 12. In some embodiments of the present invention, a reactive ion etching process can be utilized to form the recess region within the exposed portions of the substrate 12. In other embodiments of the present invention, a crystallographic etching process can be used to form the recess region within the exposed portion of the semiconductor substrate 12 in the device region not protected by the block mask 40.

A semiconductor material 42 having a different lattice constant than the semiconductor material of the semiconductor substrate 12 is then formed by an epitaxial growth process. The resultant structure after performing the above mentioned steps is shown, for example, in FIG. 9.

The semiconductor material block mask 40 is then removed from the structure utilizing an etching process that selectively removes the semiconductor material block mask 40 relative to the other materials present in the structure. An isotropic etch process is normally used. This could lead to expose sidewalls of the patterned gate dielectric material 18' in both of the device regions. The isotropic etching process removes the horizontal portions of the inner spacer 36 that are located atop the substrate 12 and that are laterally adjacent to the patterned gate dielectric material 18' in both the device regions. The resultant structure that is formed after the isotropic etch has been performed is shown in FIG. 10. In FIG. 10, reference numeral 44 denotes the opening that is formed that exposes the sidewalls of the patterned gate dielectric in both device regions.

Next, a low temperature nitridation process is performed that forms a conformal nitride-containing liner 34' on the exposed sidewalls of the patterned gate dielectric material 18' in both of the device regions. The structure including the conformal nitride-containing liner 34' is shown, for example, in FIG. 11. The conformal nitride-containing liner 34' is a thin layer typically having a thickness from 0.5 nm to 50 nm, with a thickness from 1 nm to 10 nm being even more typical.

The low temperature nitridation process that is employed in forming conformal nitride-containing liner 34' is carried out in the presence of a nitrogen-containing ambient. Nitrogen-containing ambients that can be used in forming conformal nitride-containing liner 34' include, but are not limited to $N_2$, $NH_3$, $NH_4$, NO, $NO_2$, $SiH_4$ and a mixture thereof. In some embodiments of the present invention, the nitrogen-containing ambient can be used neat. In other embodiments of the present invention, the nitrogen-containing ambient is admixed with an inert gas including, for example, one of He, Ar and Ne. When an inert gas is admixed with the nitrogen-containing ambient, the nitrogen-containing ambient is present in the admixture in a concentration from 0.1-100%. In one embodiment, $N_2$ is used as the nitrogen-containing gas.

The low temperature nitridation process is typically performed utilizing a plasma that contains the above mentioned nitrogen-containing ambients. The low temperature nitridation process is also performed at a temperature that has little or no impact on the patterned gate stack. Specifically, the low temperature nitridation process is performed at a temperature of less than 500° C., with a temperature from 100° C. to 300° C. being even more preferred. Low temperature nitridation within the aforementioned temperature range has little or no impact on the patterned gate stacks, while temperatures above the aforementioned range would negatively impact the patterned gate stack by variation of threshold voltage Vt.

It is observed that the presence of the thin conformal nitride-containing liner 34' on the exposed sidewalls of the patterned gate dielectric material 18' in both device regions, helps to eliminate the threshold variation within the FET device.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of fabricating a semiconductor structure comprising:
   providing at least one patterned gate stack in at least one device region of a semiconductor substrate, said at least one patterned gate stack including from bottom to top, a patterned gate dielectric material having a dielectric constant of greater than silicon oxide and a patterned gate conductor;
   forming an embedded semiconductor material having a different lattice constant than the semiconductor substrate within the semiconductor substrate at a footprint of the at least one patterned gate stack; and
   forming a conformal nitride-containing liner on at least exposed sidewalls of the patterned gate dielectric material, wherein said forming the conformal nitride-containing liner comprises a thermal nitridation process that is performed at a temperature of less than 500° C. in a nitrogen-containing ambient, wherein said embedded semiconductor material is formed prior to forming the conformal nitride-containing liner, and said conformal nitride-containing liner is present only on exposed sidewalls of the patterned gate dielectric material.

2. The method of claim 1 wherein said providing the at least one patterned gate stack includes providing a patterned threshold voltage adjusting layer between the patterned gate dielectric and the patterned gate conductor, wherein the patterned threshold voltage adjusting layer is a pFET threshold voltage adjusting material or an nFET threshold voltage material.

3. The method of claim 2 wherein said threshold voltage adjusting material is a pFET threshold voltage adjusting material, said pFET threshold adjusting material includes Al, $Al_2O_3$, Ge, $GeO_2$, Ta, $Ta_2O_5$, Ti, or $TiO_2$.

4. The method of claim 2 wherein said threshold voltage adjusting material is an nFET threshold voltage adjusting material, said nFET threshold adjusting material includes a rare earth metal-containing material or an alkaline earth metal-containing material.

5. A method of fabricating a semiconductor structure comprising:
   providing at least one patterned gate stack in at least one device region of a semiconductor substrate, said at least one patterned gate stack including from bottom to top, a patterned gate dielectric material having a dielectric constant of greater than silicon oxide, a patterned nFET threshold voltage adjusting layer and a patterned gate conductor, wherein said wherein said patterned nFET threshold voltage adjusting layer is an nFET threshold adjusting material selected from the group consisting of a rare earth metal-containing material and an alkaline earth metal-containing material; and
   forming a conformal nitride-containing liner on at least exposed sidewalls of the patterned gate dielectric material in both device regions, wherein said forming the conformal nitride-containing liner is performed at a temperature of less than 500° C. in a nitrogen-containing ambient.

6. The method of claim 5 further comprising forming an embedded semiconductor material having a different lattice constant than the semiconductor substrate within the semiconductor substrate at a footprint of the at least one patterned gate stack, wherein said forming the embedded semiconductor material is performed before the forming the conformal nitride-containing liner or after forming the conformal nitride-containing liner.

7. The method of claim 6 wherein said embedded semiconductor material is formed prior to forming the conformal nitride-containing liner, and said conformal nitride-containing liner is present only on exposed sidewalls of the patterned gate dielectric material.

8. A method of fabricating a CMOS structure comprising:
   providing a first patterned gate stack in a first device region of a semiconductor substrate, and a second patterned gate stack in a second device region of the semiconductor substrate, said first patterned gate stack including from bottom to top, a patterned gate dielectric material having a dielectric constant of greater than silicon oxide, and a patterned gate conductor and said second patterned gate stack including from bottom to top, a patterned gate dielectric material having a dielectric constant of greater than silicon oxide, and a patterned gate conductor;
   forming an embedded semiconductor material having a different lattice constant than the semiconductor substrate within the semiconductor substrate at a footprint of the patterned gate stacks; and
   forming a conformal nitride-containing liner on at least exposed sidewalls of the patterned gate dielectric material in both device regions, wherein said forming the conformal nitride-containing liner comprises a thermal nitridation process that is performed at a temperature of less than 500° C. in a nitrogen-containing ambient, wherein said embedded semiconductor material is formed prior to forming the conformal nitride-containing liner, and said conformal nitride-containing liner is present only on exposed sidewalls of the patterned gate dielectric material.

9. The method of claim 8 further comprising providing a patterned first threshold voltage adjusting layer between the patterned gate dielectric and the patterned gate conductor in the first patterned gate stack, and a patterned second threshold voltage adjusting layer between the patterned gate dielectric and the patterned gate conductor in the second patterned gate stack, wherein said first patterned threshold voltage layer is either a pFET threshold voltage adjusting material or an nFET threshold voltage material, while the second patterned threshold voltage layer is the other of a pFET threshold voltage adjusting material or an nFET threshold voltage material not used as the first patterned threshold voltage layer.

10. The method of claim 9 wherein said pFET threshold adjusting material includes Al, $Al_2O_3$, Ge, $GeO_2$, Ta, $Ta_2O_5$, Ti, or $TiO_2$.

11. The method of claim 9 wherein said nFET threshold adjusting material includes
a rare earth metal-containing material or an alkaline earth metal-containing material.

12. A method of fabricating a CMOS structure comprising:
providing a first patterned gate stack in a first device region of a semiconductor substrate, and a second patterned gate stack in a second device region of the semiconductor substrate, said first patterned gate stack including from bottom to top, a patterned gate dielectric material having a dielectric constant of greater than silicon oxide, a patterned first threshold voltage adjusting layer, and a patterned gate conductor and said second patterned gate stack including from bottom to top, a patterned gate dielectric material having a dielectric constant of greater than silicon oxide, a patterned second threshold voltage adjusting layer and a patterned gate conductor, wherein said first patterned threshold voltage layer is either a pFET threshold voltage adjusting material or an nFET threshold voltage material, while the second patterned threshold voltage layer is the other of a pFET threshold voltage adjusting material or an nFET threshold voltage material not used as the first patterned threshold voltage layer and wherein said nFET threshold adjusting material includes a rare earth metal-containing material or an alkaline earth metal-containing material;
forming an embedded semiconductor material having a different lattice constant than the semiconductor substrate within the semiconductor substrate at a footprint of one of the patterned gate stacks;
selectively exposing a sidewall of said patterned gate dielectric material of each of said patterned gate stacks; and
forming a conformal nitride-containing liner on at least exposed sidewalls of the patterned gate dielectric material in both device regions, wherein said forming the conformal nitride-containing liner comprises a thermal nitridation process that is performed at a temperature of less than 500° C. in a nitrogen-containing ambient.

13. The method of claim 12 wherein said pFET threshold adjusting material includes Al, $Al_2O_3$, Ge, $GeO_2$, Ta, $Ta_2O_5$, Ti, or $TiO_2$.

14. A method of fabricating a semiconductor structure comprising:
providing at least one patterned gate stack in at least one device region of a semiconductor substrate, said at least one patterned gate stack including from bottom to top, a patterned gate dielectric material having a dielectric constant of greater than silicon oxide and a patterned gate conductor;
forming an embedded semiconductor material having a different lattice constant than the semiconductor substrate within the semiconductor substrate at a footprint of the at least one patterned gate stack; and
forming a conformal nitride-containing liner on at least exposed sidewalls of the patterned gate dielectric material, wherein said forming the conformal nitride-containing liner is performed at a temperature of less than 500° C. in a nitrogen-containing ambient, wherein said embedded semiconductor material is formed prior to forming the conformal nitride-containing liner, and said conformal nitride-containing liner is present only on exposed sidewalls of the patterned gate dielectric material.

15. A method of fabricating a CMOS structure comprising:
providing a first patterned gate stack in a first device region of a semiconductor substrate, and a second patterned gate stack in a second device region of the semiconductor substrate, said first patterned gate stack including from bottom to top, a patterned gate dielectric material having a dielectric constant of greater than silicon oxide, and a patterned gate conductor and said second patterned gate stack including from bottom to top, a patterned gate dielectric material having dielectric constant of greater than silicon oxide, and a patterned gate conductor, wherein a patterned first threshold voltage adjusting layer is located between the patterned gate dielectric and the patterned gate conductor in the first patterned gate stack, and a patterned second threshold voltage adjusting layer is located between the patterned gate dielectric and the patterned gate conductor in the second patterned gate stack, said first patterned threshold voltage layer is either a pFET threshold voltage adjusting material or an nFET threshold voltage material, while the second patterned threshold voltage layer is the other of a pFET threshold voltage adjusting material or an nFET threshold voltage material not used as the first patterned threshold voltage layer; and
forming a conformal nitride-containing liner on at least exposed sidewalls of the patterned gate dielectric material in both device regions, wherein said forming the conformal nitride-containing liner is performed at a temperature of less than 500° C. in a nitrogen-containing ambient.

16. The method of claim 15 wherein said pFET threshold adjusting material includes Al, $Al_2O_3$, Ge, $GeO_2$, Ta, $Ta_2O_5$, Ti, or $TiO_2$.

17. The method of claim 15 wherein said nFET threshold adjusting material includes a rare earth metal-containing material or an alkaline earth metal-containing material.

18. The method of claim 15 further comprising forming an embedded semiconductor material having a different lattice constant than the semiconductor substrate within the semiconductor substrate at a footprint of one of the patterned gate stacks, wherein said forming the embedded semiconductor material is performed before the forming the conformal nitride-containing liner or after forming the conformal nitride-containing liner.

19. The method of claim 18 wherein said embedded semiconductor material is formed prior to forming the conformal nitride-containing liner, and said conformal nitride-containing liner is present only on exposed sidewalls of the patterned gate dielectric material.

* * * * *